United States Patent
Gross, Jr.

[11] Patent Number: 6,154,165
[45] Date of Patent: Nov. 28, 2000

[54] VARIABLE CLOCK RATE, VARIABLE BIT-DEPTH ANALOG-TO-DIGITAL CONVERTER

[75] Inventor: George Francis Gross, Jr., Fleetwood, Pa.

[73] Assignee: Lucent Technologies Inc., Murray Hill, N.J.

[21] Appl. No.: 09/153,184

[22] Filed: Sep. 16, 1998

[51] Int. Cl.$^7$ .................................................. C01F 1/00
[52] U.S. Cl. ........................ 341/164; 341/155; 341/162
[58] Field of Search .................................. 341/161, 164, 341/123, 155, 162

[56] References Cited

U.S. PATENT DOCUMENTS 5,260,705   11/1993   Inukai ..................................... 341/155

*Primary Examiner*—Brian Young
*Assistant Examiner*—John Nguyen
*Attorney, Agent, or Firm*—David L. Smith

[57] ABSTRACT

An integrated circuit includes a variable bit-depth successive approximation analog-to-digital converter. The variable bit-depth successive approximation analog-to-digital converter can select from at least two clock signals of different frequencies to drive the variable bit-depth successive approximation converter for each bit depth application. Within each bit-depth application, the converter may employ more than one clock frequency.

10 Claims, 6 Drawing Sheets

$$V_{C1}(t) = V_0 (1 - e^{-t/RC})$$

$$t = 0.684 \text{ ns}$$

VARIABLE CLOCK RATE, VARIABLE BIT-DEPTH ANALOG-TO-DIGITAL CONVERTER

TECHNICAL FIELD

This application relates to analog-to-digital converters and more particularly to successive approximation converters in which the bit-depth, that is the number of bits of conversion, is changed.

BACKGROUND OF THE INVENTION

Analog-to-digital converters (ADCs) are used to convert an analog signal to a digitally coded signal. ADCs span a spectrum of designs that range from parallel flash-type converters employing multiple comparators that generally require a single clock cycle to determine all bits of resolution at one end of the spectrum, to a successive approximation-type converter that generally requires one clock cycle per bit of resolution at the other end of the spectrum. In order to achieve a high-speed conversion with little latency, a large number of comparators are employed in a flash converter. While flash converters achieve a fast conversion, they consume relatively large amounts of power. Successive approximation converters consume relatively less power than flash converters but introduce latency in converting an analog signal to a digitally coded signal.

Some ADCs are used in shared applications where several different analog signals are converted to digitally coded representations of signals with different bit-depth requirements. For example, a converter on an integrated circuit may be required to convert several voice channels at a bit depth of 13 bits, battery voltage at a bit depth of 8 bits, temperature at a bit depth of 6 bits, and radio frequency power at a bit depth of 5 bits.

Heretofore, successive approximation ADCs operating on a variable bit-depth have been designed to operate on a fixed frequency clock, with the bit determination, of all bit-depth applications, requiring the longest time being less than or equal to a clock cycle in duration. However, some time is wasted in a successive approximation conversion since not all bit determinations require the same amount of time. With variable bit depth successive approximation ADCs designed based on the worst-case bit determination time, all bit determinations other than the worst-case bit determination wastes a portion of a clock cycle by completing the conversion of bits in less time than the clock cycle duration.

What is needed is a technique to improve the speed of conversion of a variable bit-depth, successive approximation ADC such as by choosing the duration of a clock signal driving the successive approximation ADC based on the number of bits being generated in the digitally coded representation.

SUMMARY OF THE INVENTION

In accordance with an illustrative embodiment of the present invention, an integrated circuit includes a variable bit-depth successive approximation analog-to-digital converter. The variable bit-depth successive approximation analog-to-digital converter can select from at least two clock signals of different frequencies to drive the variable bit-depth successive approximation converter for each bit-depth application. Within each bit-depth application, the converter may employ more than one clock frequency.

DETAILED DESCRIPTION

Figure 1:
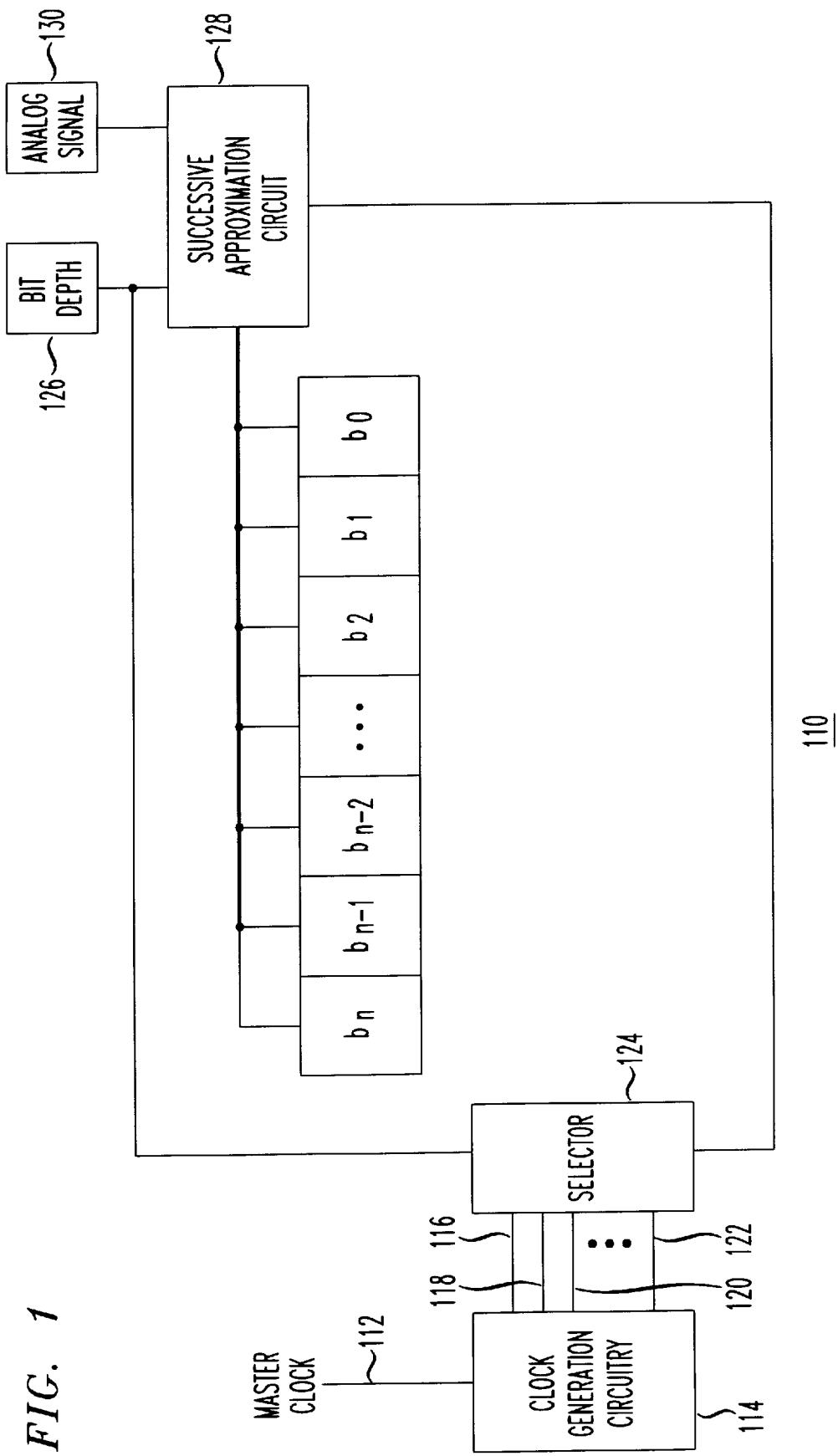
FIG. 1 is a schematic diagram of an analog-to-digital converter in accordance with the present invention.

A variable bit-depth converter is designed to convert a sampled analog signal into a digitally encoded representation having at least the largest number of bits required by any of its applications. When less than the largest number of bits are required, the conversion process is truncated at the bit-depth, or number of bits, desired. When a variable bit-depth successive approximation converter is used to convert a sampled analog signal into a digitally encoded representation that is less than the maximum number of bits, the dynamics of the successive approximation converter are such that settling time to be within one least significant bit of a final value so that a bit decision can be made is less than the settling time required to be within one least significant bit of a final value so that a bit decision can be made when the bit-depth is the maximum. In other words, a successive approximation converter designed for a specific bit-depth will settle faster when used to convert sampled analog signals to a bit-depth less than the maximum bit-depth. Generally, the smaller the bit-depth of conversion the more quickly the successive approximation converter will settle to within one least significant bit of a final value.

Since successive approximation converters generally require one clock cycle per bit determination, and since less time is required for bit determinations in a variable bit-depth converter where the bit-depth is less than the maximum the converter can produce, the clock signal used to drive a variable bit-depth converter can be selected based on the bit-depth required.

In this manner, less time of each clock cycle is wasted, resulting in less time required for each bit determination and hence faster conversion of a sampled analog signal into a digitally encoded representation. A schematic diagram of a variable bit-depth, analog-to-digital converter 110 in accordance with the present invention shown in FIG. 1. ADC 110 is a successive approximation converter and may be of any type, including but not limited to a fixed range or a sub-ranging converter, a single ended or a differential converter, a current driven or voltage driven converter, or a resistor string, current summing or charge summing converter. Converter 110 is of a variable bit-depth design capable of converting sampled analog signals into a plurality of bits, a plurality being two or more.

A master clock signal 112 is either received by or generated by clock generation circuit 114. A number of clock signals 116, 118, 120 and 122, referred to collectively as available clock signals, of different frequencies, and hence different clock periods, are generated such as from the master clock signal 112. The available clock signals are provided to selector circuits 124. The bit-depth 126 of a particular application is provided to successive approximation circuit 128. When successive approximation circuit 128 is determining one of the plurality bits of a digital signal representation of a sample of analog signal 130 input, one of the available clock signals generated by clock generation circuit 114 is provided to successive approximation circuit 128 by way of selector circuit 124. Available clock signals 116, 118, 120 and 122 are illustrative and may be, for example, the master clock signal and integral or non-integral multiples of the master clock signal. Thus, by way of example, clock signal 116 may be the master clock signal, clock signal 118 may be 1.5 times the frequency of the master clock signal, clock signal 120 may be twice frequency of the master clock signal, and clock signal 122 may be four times the frequency of the master clock signal.

Once the bit-depth 126 has been selected, selector 124 selects one of the available clock signals to provide to successive approximation circuit 128 to convert analog signal 130 to the bit-depth selected. When converter 110 is used to convert the same or another analog signal to a different bit-depth, the desired bit-depth 126 is selected the analog signal 130 is provided to successive approximation circuit 128, and selector 124 selects one of the available clock signals to provide to successive approximation circuit 128 to use in the conversion. Each bit-depth 126 may utilize a different clock signal. The clock signal used for a particular bit-depth conversion is of a frequency to provide a clock period of sufficient duration to complete the worst case bit determination within the clock period.

Figure 2:
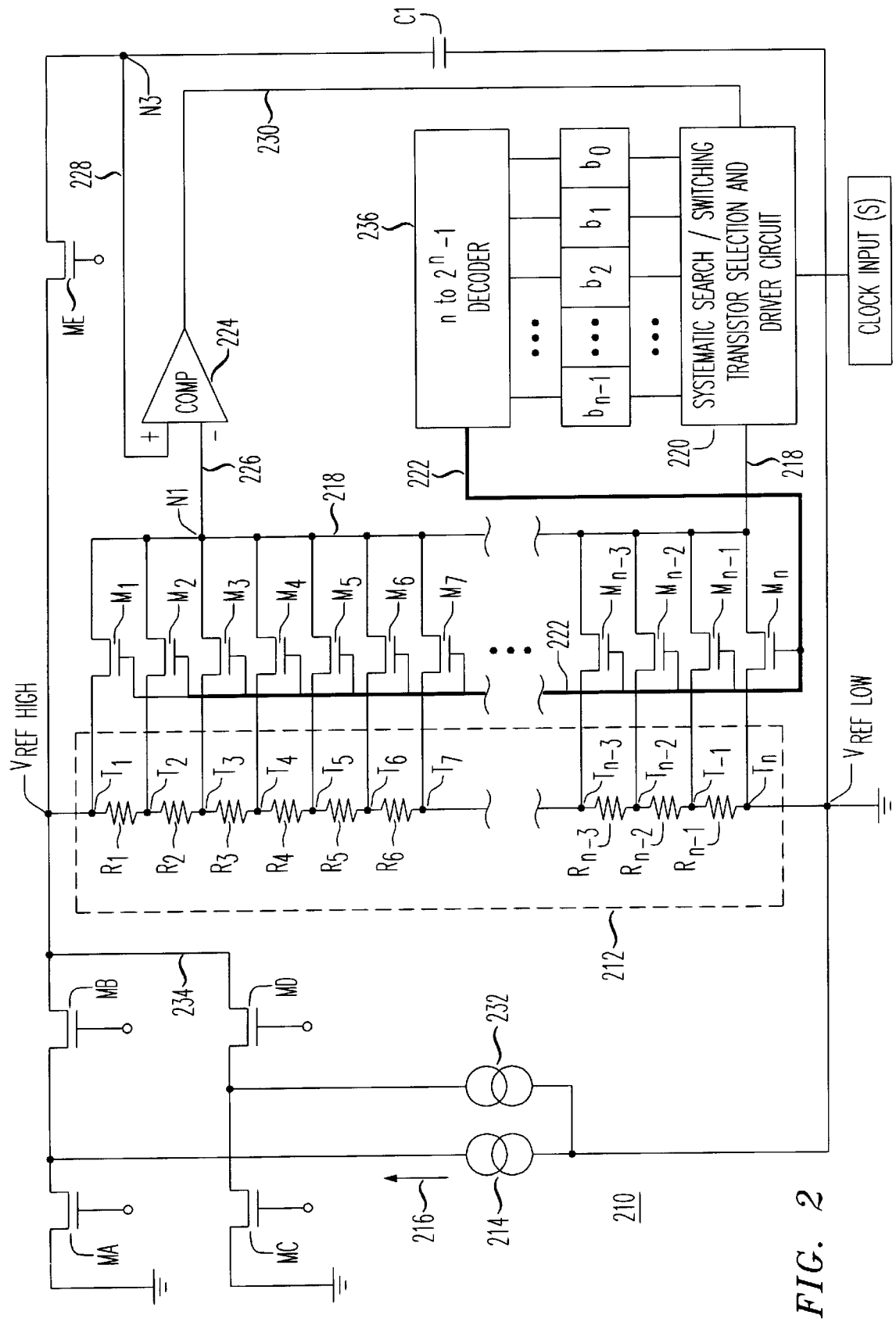
FIG. 2 is a schematic diagram of a successive approximation circuit that may be used as part of the analog-to-digital converter of FIG. 1.

A schematic diagram of a successive approximation circuit 210 useful in the converter 110 of FIG. 1 is shown in FIG. 2. Successive approximation circuit 210 is a multibit analog-to-digital converter capable of converting an incoming analog signal 232 to a multibit digitally encoded representation. The digital representation may be of any known convention, for example, binary, 2's-complement, or sign magnitude.

Resistor string 212 is comprised of a user determined number N-1, of substantially equal resistors designated R1 through R N-1. Resistor string 212 is coupled between an upper reference VREFHIGH and lower reference VREFLOW. VREFHIGH is coupled to a power source, such as reference current source 214 which provides a constant current 216 to resistor string 212 (with transistor MB in the on-state and transistors MA and ME in the off-state) when successive approximation circuit 210 is employed as a stand-alone digital-to-analog converter or when successive approximation circuit 210 is incorporated in an analog-to-digital converter 110 as shown in FIG. 1. The resistance values of resistors comprising resistor string 212 are application dependent and can be readily selected by one skilled in the art based on a variety of parameters such as the power to be dissipated, the potential across, or developed across, the resistor string, the number of resistors in the resistor string and the number of bits of resolution of the converter. Typically, the impedance of each resistor in resistor string 212 is equal. See for example, U.S. Pat. No. 5,534,862, the disclosure of which is hereby incorporated by reference.

At the resistor junctions as well as the power source-resistor junctions, a switch, M, is coupled between the junction and a node such as node N1 on bus 218. The junctions define intermediate taps T1 through TN. The switches, N in number, which are preferably transistors, associated with the resistor string are shown in the illustrative embodiment as metal oxide semiconductor (MOS) transistors M1 through MN. Transistors M1 through MN each couple an intermediate tap, T1 through TN respectively, with bus 218 and hence node N1. Each transistor M1 through MN has its source-to-drain path coupled between bus 218, and hence node N1, and a respective intermediate tap. Transistors M1 through MN have their gate terminals coupled to a systematic search/switching transistor selection and driver circuit 220 by way of bus 222 and decoder 236. Each of taps T1 through TN is capable of being switched by a respective one of transistors M1 through MN to couple to a common bus 218 providing N, where $N=2^n$ voltages with n being defined as the number of bits in a digital signal representation of a sampled analog signal.

Transistors MA, MB, MC and MD as described below, alternately provide the analog signal illustrated as 232, which is to be sampled and converted, and a reference current 216 to other portions of successive approximation circuit 210.

Transistor ME, together with capacitor C1, comprise a sample and hold circuit. A sample of the analog signal 232 is applied to capacitor C1 as described below. Capacitor C1 is coupled between node N3 and the lower potential reference, VREFLOW. Capacitor C1 maintains the voltage developed thereon as the sampled analog signal being converted and provides the sampled analog signal as a positive input to comparator 224.

Comparator 224 has a first input 226 coupled to node N1 on bus 218, a second input 228 coupled to node N3 at capacitor C1, and an output 230. Output 230 is coupled as an input to systematic search/switching transistor selection and driver circuit 220.

In operation as an analog-to-digital converter, transistors MA, MD and ME are switched to be in the on-state, and transistors MB and MC, are switched to be in the off-state, an analog signal illustrated as 232 is received on line 234. The analog signal 232 passes through resistor string 42 and in the process develops a voltage across resistor string 212 which charges capacitor C1 with the voltage developed at VREFHIGH. Due to transistor MA being in the on-state current produced by reference current source 214 is driven to ground. The voltage developed across resistor string 212 charges capacitors C1 to develop the sampled analog signal that is being converted to a digitally encoded signal and provides a positive input to comparator 224 over line 228. Since each of transistors MD and ME, along with the trace or conductor that couples these transistors to capacitor C1, have a finite impedance, an RC network is present and some time is required for capacitor C1 to charge to the voltage developed at VREFHIGH.

Figure 4:
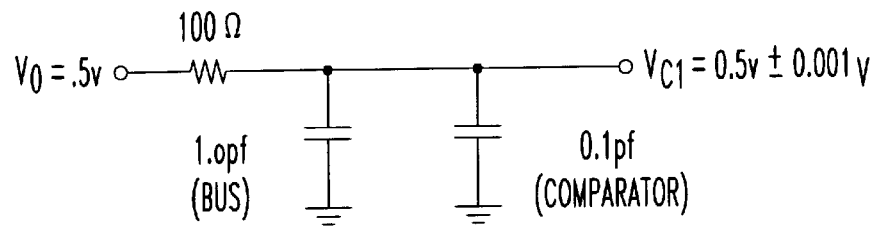
FIG. 4 is an equivalent circuit to the successive approximation circuit of FIG. 2 when determining the most significant bit.

With capacitor C1 charged to the voltage developed at VREFHIGH, transistors MA, MD and ME are switched to be in the off-state and transistors MB and MC are switched to be in the on states. At this point in operation of the ADC, the analog input signal 232 has been sampled. In this configuration, the analog signal 232 is sent to ground and a reference voltage is developed at VREFHIGH with a known voltage gradient developed across resistor string 212. Transistor ME in the off-state isolates capacitor C1 and the sampled signal stored thereon from resistor string 212 and the voltage gradient developed on resistor string 212. After the analog input signal has been sampled and settled, and a voltage gradient has been developed across resistor string 212 and it has settled, the switching transistor M(N/2) at the midpoint of resistor string 212 is switched on and the voltage developed at the midpoint of the resistor string, such as at tap TN/2, is coupled to bus 218 and hence node N1. The voltage provided at node N1 requires some time to settle due to the capacitance of bus 218 being charged and the switch not having zero impedance. An equivalent circuit of the successive approximation circuit 210 in this configuration is shown in FIG. 4 and will be discussed further below.

With a reference voltage or current applied to resistor string 212, once bus 218 has settled into its final value or sufficiently close to its final value, comparator 224 compares the voltage developed at the midpoint of resistor string 212 (at tap (TN/2)+1) to the sampled analog signal stored on capacitor C1 to determine the most significant bit of the digital encoded representation of the sampled analog signal. For example, if the sampled analog signal stored on capacitor C1 is greater than the voltage developed of resistor string 212 (at tap (TN/2)+1), the most significant bit (MSB) is a logic one and if the sampled analog signal stored on capacitor C1 is less than the voltage developed at the midpoint of resistor string 212 tap (TN+1/2), the MSB is a logic zero.

Once the most significant bit is determined, the systematic search/switching transistor selecting and driver circuit 220 systematically switches the transistor coupling the midpoint of resistor string to make N1 (transistor M(N/2)) to the off-state and switches one of transistors M((N×3)/4) or transistor M(N/4) to the on-state, depending on whether the MSB was a one or a zero. These transistors represent coupling the point that is halfway between the midpoint of the resistor string and the upper and lower voltage references respectively, to bus 218 and hence node N1. When the MSB is determined to be a one, a switching transistor is turned on to couple the tap at the midpoint of the upper half of the resistor string 212 to node N1. When the MSB is determined to be a zero, a switching transistor is turned on to couple the tap at the midpoint of the lower half of the resistor string 212 to bus 218 and hence node N1.

Since resistor string 212 is symmetrical about its midpoint, the analysis is the same without regard to whether the second most significant bit is determined by comparing the reference voltage developed in the upper half of the resistor string to the sampled analog signal, such as when the MSB is one, or whether the second most significant bit is determined by comparing a reference voltage developed in the lower half of the resistor string to the sampled analog signal such as when the MSB is zero.

With reference to the equivalent circuit shown in FIG. 4, the most significant bit determination is accomplished after an input sample/hold settling time during which the digital-to-analog converter is preset for the first preselected trial voltage point and the resistor string voltage settling due to resistor and capacitor changes and possible momentary selective overlap in the decoder 236 as it proceeds from one decoded output of 1 of $2^n-1$ to a second decoded output of 1 of $2^n-1$ occurs during the input sample and hold time. Thus, when determining the most significant bit, the settling time required for the successive approximation circuit 210 is the settling time for bus 218 and comparator 224. For subsequent bit determinations, two sequential settling times are required; the resistor string must settle and bus 218 and comparator 224 must settle.

By way of example, consider a 10-bit analog-to-digital converter with VREFHIGH at one volt and VREFLOW at ground. The least significant bit is represented by approximately one millivolt, $[(1 \text{ volt}/(2^{10}-1)]$. Assume the sampled and held analog input voltage to be converted is 0.384 volts. The most significant bit (bit 9) determination cannot take place until bus 218 and comparator 224 have settled to within the voltage of the least significant bit, 0.001 volts. Assuming each switching transistor M1 through MN has an impedance of 100 ohms in the on-state and the capacitance of bus 218, as seen by the midpoint switching transistor, is approximately one picofarad, and the additional capacitance of comparator 224 is approximately 0.1 picofarad, the equivalent circuit is shown in FIG. 4. Since a reference voltage of one volt was developed across resistor string 212 and the midpoint is coupled by one of switching transistors M1–MN to bus 218, the voltage applied to the 100 ohm impedance of the midpoint switching transistor is 0.5 volts. The time constant of the equivalent circuit shown in FIG. 4 can be calculated to be 0.684 nanoseconds to allow the voltage at the comparator to reach 0.499 volts which is to within the value of one LSB of the voltage developed at the midpoint of the resistor string 212. The time constant of the equivalent circuit shown in FIG. 4 represents the settling time of bus 218 such that output 230 of comparator 224 is considered sufficiently settled to make a bit determination of the most significant bit. Once settled, since the example of 0.384 volts representing the sampled analog signal is less than 0.5 volts, bit 9 is determined to be a logic zero.

As a result, the succeeding bit determination of bit 8 will cause a switching transistor at the midpoint of the lower half of resistor string 212 (M(N/4)) to couple the midpoint of the lower half of the resistor string 212 to bus 218. This can be stated as the VREFHIGH/4 point on resistor string 212 since VREFLOW is ground.

Figure 5:
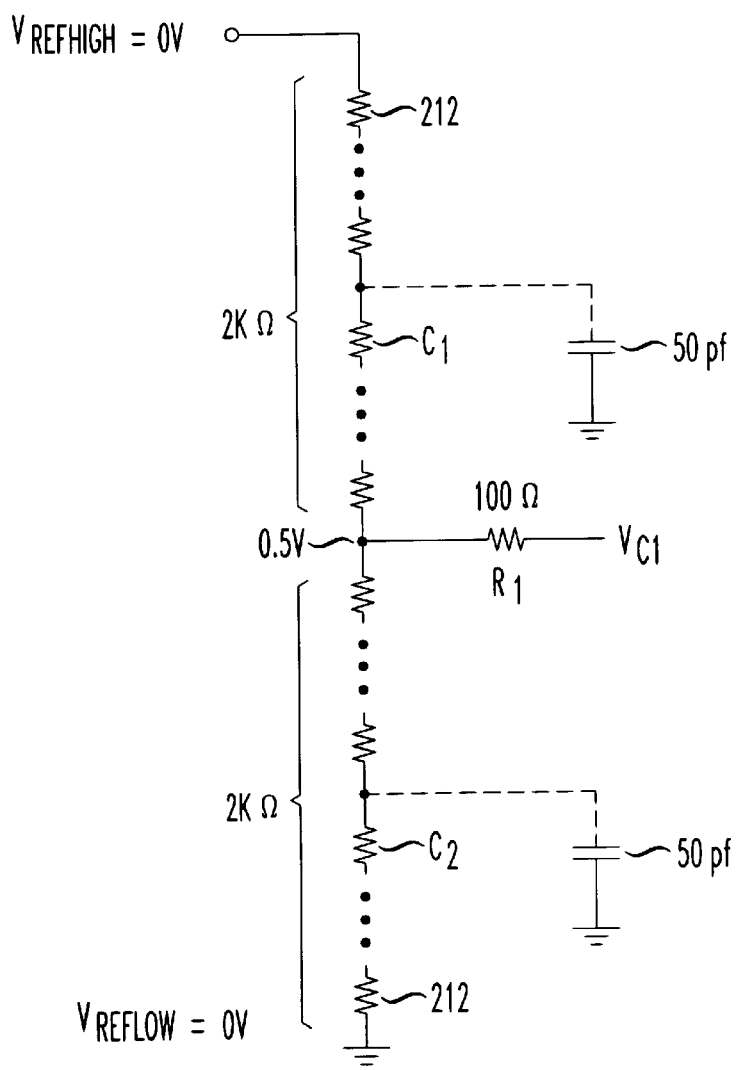
FIGS. 5, 6 and 7 are equivalent circuits to the successive approximation circuit of FIG. 2 when determining the second most significant bit.
Figure 6:
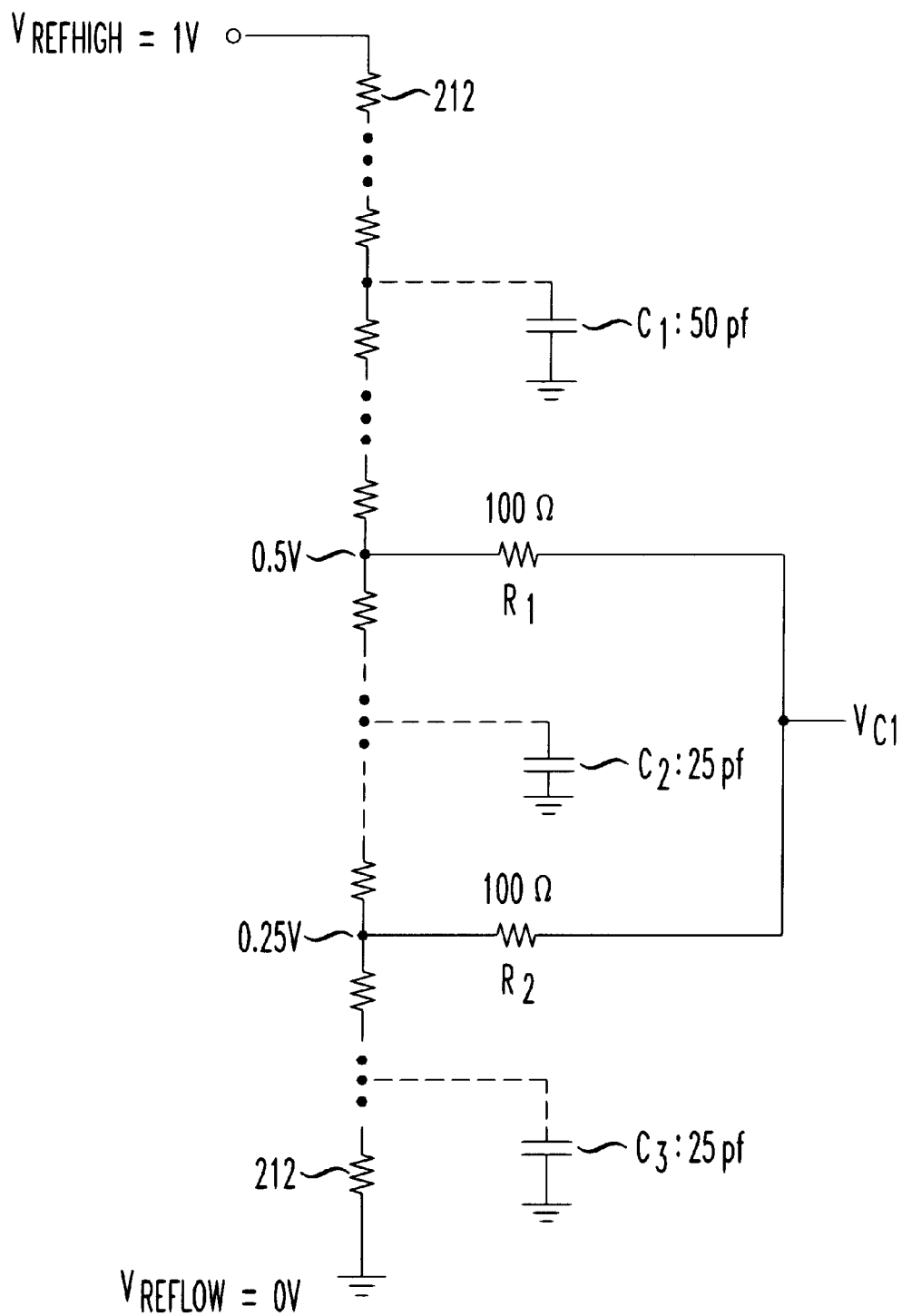
Figure 7:
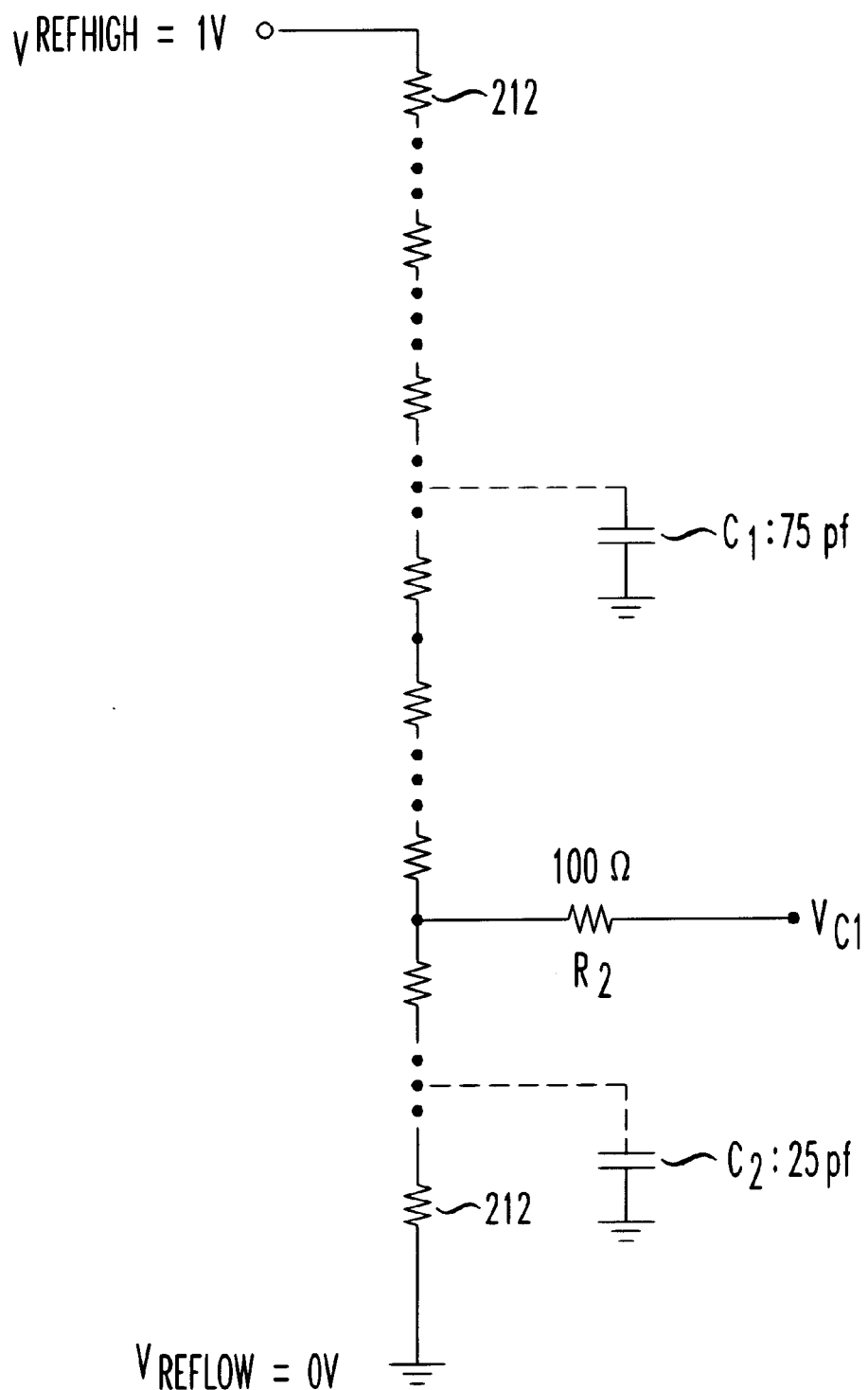

FIGS. 5, 6 and 7 are equivalent circuits to the successive approximation circuit of FIG. 2 when determining the second-most significant bit at the onset of the second most significant bit determination, during the second most significant bit determination and at the end of the second most significant bit determination, respectively. Assuming the distributed capacitances (shown in dashed lines) are the sum of individual resistor string-connected switches M1–MN, and assume that during the decode uncertainty, the section of resistors between the former tap (0.5 volts) and the next tap (0.25 volts) is shorted for a sufficient time that the distributed capacitance between 0.5 volts and 0.25 volts assumes a charge midway between those two voltages before attempting to settle to the new voltage of 0.25 volts. Also assuming that only after node N1 has settled to within one LSB value (0.001 volts) of the new tap voltage of 0.25 volts, that is to between 0.249 and 0.251 volts, can the bus and comparator structure settle. Three segments of the resistor string should be considered. From the midpoint to VREFHIGH, from the midpoint to the midpoint of the lower half of the resistor string and from the midpoint of the lower half of the resistor string to VREFLOW. Since the interim value is half-way between the starting value and the final value and since the resistance and capacitance haven't changed, then the discharge time constant equals the charge time constant and the time for each of the segments to settle to their interim value is approximately equal to the time for each of them to settle to their final values. While all of the segments are simultaneously attempting to settle to steady state values, as a first order approach, the longest settling time segment can be considered as the worst case. For determination of the second-most significant bit, that is the segment with the largest differential voltage, resistance and capacitance which is the segment of resistor string 212 between the midpoint of resistor string 212 and voltage reference VREFHIGH.

With resistor string 212 having an impedance, for this example of 4 kilohms from FIG. 4, the segment from the midpoint of resistor string 212 to voltage reference VREFHIGH has an impedance of 2 kilohms as the second most significant bit determination proceeds from its initial state (FIG. 5) to its interim state (FIG. 6). The midpoint voltage of this segment changes from 0.75 volts to 0.66 volts as the decoder 236 switches its 1 of 1023 outputs from the midpoint, i.e., $(2^{10}-1)/2$ to the quarter point, i.e., $(2^{10}-1)/4$, a change of 0.09 volts. Since the voltage must settle to within the value of one LSB of 0.09 volts, that is to within 0.089 volts, the settling time constant can be calculated as 225 nanoseconds. For the upper half of the resistor string 212 to resettle to its original value of 0.75 volts then requires twice as long, i.e., 2×225 nanoseconds or 450 nanoseconds since the charge time equals the discharge time.

To complete the settling time prior to the determination of the second most significant bit (here bit 8 in the example) the time for the bus 218 and comparator 224 to settle is determined as the time required to drop the voltage at node N1 from 0.5 volts (the final value in the determination of the MSB) to within one LSB of 0.25 volts. Since the bus 218 resistance is very low and the input capacitance of the capacitor is also very low the resultant RC time constant is very low especially compared with the time constant due to resistor string resistors and switch capacitance. Typical calculations yield an RC time constant of less than one (1) nanosecond. Since the settling time required for the bus and comparator to settle to within the value of one LSB of its final value is greater than an order of magnitude smaller than the time required for the resistor string itself to settle, the settling time for the bus and comparator may be ignored.

Using this technique, similar calculations on subsequent bit determinations and bit determinations of each bit-depth can be made and are summarized in Table 1 for selected bit-depths.

TABLE 1

String Settling Time, in Nanoseconds

| Bit No. (Relative) | Bit-Depth: 13 | Bit-Depth: 10 | Bit-Depth: 8 | Bit-Depth: 6 |
|---|---|---|---|---|
| MSB | — | — | — | — |
| MSB-1 | 658 | 450 | 312 | 173 |
| MSB-2 | 1837 | 1187 | 754 | 321 |
| MSB-3 | 1413 | 827 | 436 | 45 |
| MSB-4 | 1224 | 631 | 247 | — |
| MSB-5 | 1084 | 466 | 55 | — |
| MSB-6 | 901 | 267 | — | — |
| MSB-7 | 681 | 55 | — | — |
| MSB-8 | 475 | — | — | — |
| MSB-9 | 266 | — | — | — |
| MSB-10 | 56 | — | — | — |
| MSB-11 | — | — | — | — |
| MSB-12 | — | — | — | — |

Based on the settling time of the string only, it can be seen from Table 1 that the same duration of time and hence the same duration clock cycle is not required for each bit-depth at which the converter operates. Note that the time calculations do not account for comparator switching time since comparator switching time is orders of magnitude less than string settling time. Generally, the settling time is less for smaller bit-depths.

Table 2 illustrates the closest period for each bit determination for any bit-depth configuration of the converter can be taken as the longest bit settling time for that bit-depth configuration of the converter. Table 2 assumes a fixed clock frequency is applied to convert each bit in a particular bit-depth configuration of the converter.

This invention may be combined with the technique taught in my concurrently filed, copending application entitled "Variable Clock Rate Analog-to-Digital Converter", the disclosure of which is hereby incorporated by reference. As can be seen from Table 1, the bit determination time is not constant for all bit determinations at a particular bit-depth. By employing multiple clock signals and selecting a clock signal based both on the bit-depth and which bit is being determined at a particular bit-depth, the conversion time can be reduced.

Figure 3:
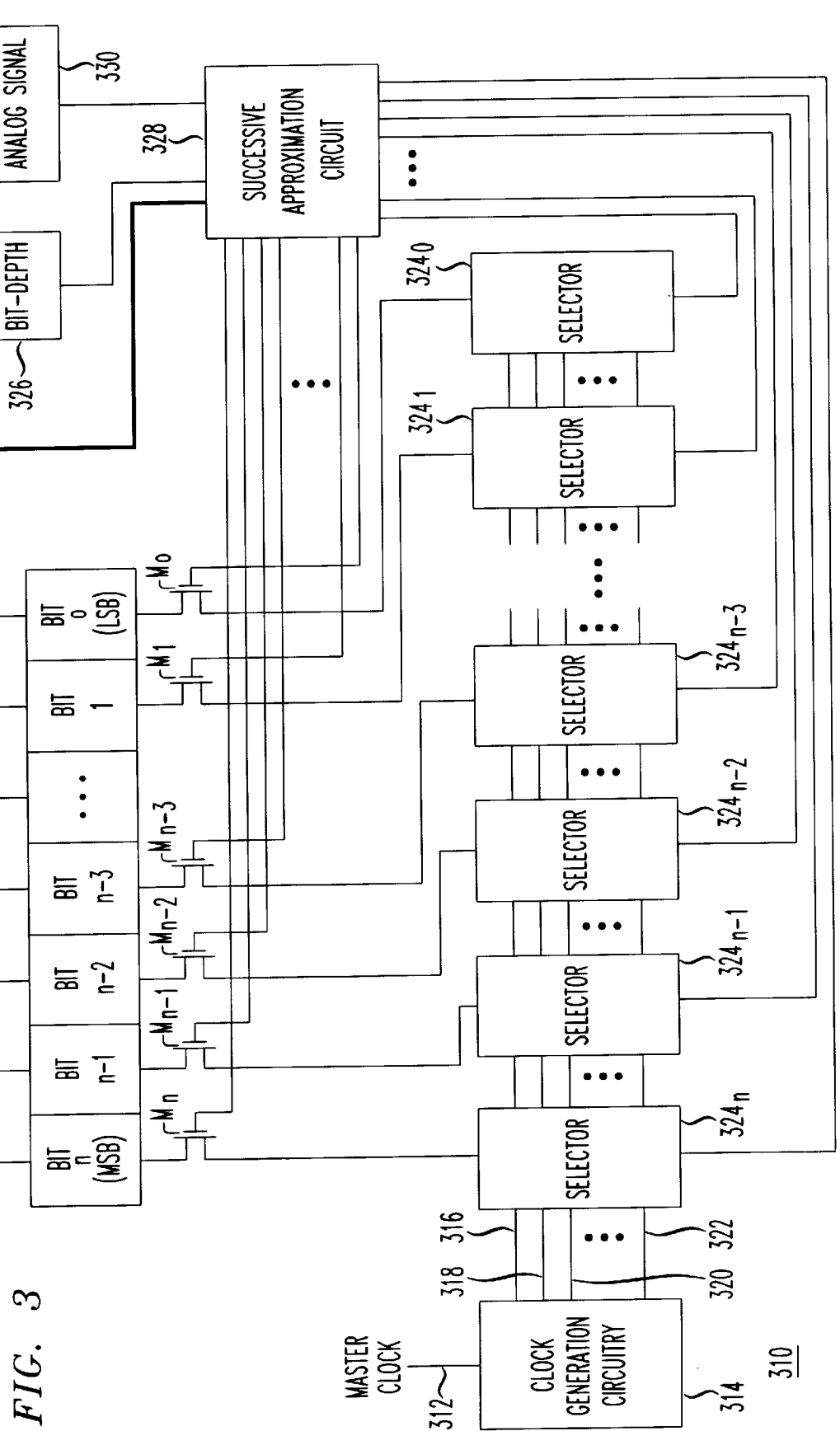
FIG. 3 is a schematic diagram of an alternative embodiment converter in accordance with the present invention in which the clock rate is varied for each bit determination in a particular bit depth application.

A schematic diagram of an alternate embodiment variable bit-depth, analog-to-digital converter 310 in accordance with the present invention shown in FIG. 3. ADC 310 is a successive approximation converter and, like converter 110, may be of any type. Converter 310 is of a variable bit-depth, variable clock converter capable of converting sampled analog signals into a plurality of bits, a plurality being two or more in which the clock signal is selected based not only on the bit-depth, but also which bit is being determined.

A master clock signal 312 is either received by or generated by clock generation circuit 314. A number of clock signals 316, 318, 320 and 322, referred to collectively as available clock signals, of different frequencies, and hence different clock periods, are generated such as from the master clock signal 312. The available clock signals are provided to selector circuit 324. The bit-depth 326 of a particular application is provided to successive approximation circuit 328. When successive approximation circuit 328 is determining one of the plurality bits of a digital signal representation of a sample of analog signal 330 input, successive approximation circuit 328 selects one of the available clock signals generated by clock generation circuit 314 by way of an associated switch, M, and selector circuit 324 to provide to successive approximation circuit 328. The switches, M, are preferably transistors and are shown in the illustrative embodiment as MOS transistors using a simplified schematic symbol. Available clock signals 316, 318, 320

TABLE 2

| Bit No. (Relative) | Period for 13-Bit | Period for 10-Bit Based on 13-Bit | Period for 10-Bit Based on Best Choice | Period for 8-Bit Based on 13-Bit | Period for 8-Bit Based on Best Choice | Period for 6-Bit Based on 13-Bit | Period for 6-Bit Based on Best Choice |
|---|---|---|---|---|---|---|---|
| MSB | 500 Khz | 500 Khz | 750 Khz | 500 Khz | 1 Mhz | 500 Khz | 2 Mhz |
| MSB-1 | 500 Khz | 500 Khz | 750 Khz | 500 Khz | 1 Mhz | 500 Khz | 2 Mhz |
| MSB-2 | 500 Khz | 500 Khz | 750 Khz | 500 Khz | 1 Mhz | 500 Khz | 2 Mhz |
| MSB-3 | 500 Khz | 500 Khz | 750 Khz | 500 Khz | 1 Mhz | 500 Khz | 2 Mhz |
| MSB-4 | 500 Khz | 500 Khz | 750 Khz | 500 Khz | 1 Mhz | 500 Khz | 2 Mhz |
| MSB-5 | 500 Khz | 500 Khz | 750 Khz | 500 Khz | 1 Mhz | 500 Khz | 2 Mhz |
| MSB-6 | 500 Khz | 500 Khz | 750 Khz | 500 Khz | | | |
| MSB-7 | 500 Khz | 500 Khz | 750 Khz | 500 Khz | | | |
| MSB-8 | 500 Khz | 500 Khz | 750 Khz | | | | |
| MSB-9 | 500 Khz | 500 Khz | 750 Khz | | | | |
| MSB-10 | 500 Khz | | | | | | |
| MSB-11 | 500 Khz | | | | | | |
| MSB-12 | 500 Khz | | | | | | |
| TOTAL CONVERSION TIME IN NANOSECONDS | 26 | 30 | 13.33 | 16 | 8 | 12 | 3 |

Adding a discrete period of time, such as 20 nanoseconds for digital processing, and assuming available clock rates of 500 kHz, 750 kHz, 1 MHz and 2 MHz, Table 2 is developed.

and 322 are illustrative and may be, for example, the master clock signal and integral or non-integral multiples of the master clock signal. Thus, by way of example, clock signal 316 may be the master clock signal, clock signal 318 may be 1.5 times the frequency of the master clock signal, clock signal 320 may be twice frequency of the master clock signal, and clock signal 322 may be four times the frequency of the master clock signal.

Once the bit-depth 326 has been selected, successive approximation circuit 328 in conjunction with switches M and selector circuit 324 selects one of the available clock signals to provide to successive approximation circuit 328 to convert the first bit of sampled analog signal 330 to the bit-depth selected. The next and subsequent bit determinations may use the same or a different clock signal, as determined by switches M and selector circuit 324 based on apriori information.

One skilled in the art could employ the teaching of this technique for each bit-depth to calculate the duration of time required for each bit determination based on (1) the time constant of an equivalent circuit in the converter that must settle, (2) the voltages applied to the circuits, (3) the worst case final value to which the circuit must settle, (4) a tolerance of the voltage to which the circuit must settle as determined by the voltage represented by the least significant bit. Each bit determination may employ a different clock frequency, or a particular clock frequency could be used for multiple bit determinations. The clock signals may be generated within the analog-to-digital converter, or may be provided to the analog-to-digital converter.

While the invention has been illustrated using an analog-to-digital converter including a single ended, resistor string, where the converter produces a digitally encoded representation of a sampled analog signal of a specific bit-depths, the invention is not limited thereto. Also while the invention has been illustrated using a resistor string comprised of $2^n$ equal resistance resistors, the invention is not limited thereto. Furthermore, the invention may be used in an integrated circuit such as a microprocessor, microcontroller or digital signal processor, or be a stand-alone converter.

What is claimed is:

1. A method of converting analog signals to multibit representation, comprising the steps of:
   selecting a first bit-depth for converting a first sampled analog signal to a digital representation;
   selecting a clock signal, having a frequency, to clock a successive approximation circuit based on the first bit-depth to convert the first sampled analog signal to a digital representation;
   selecting a second bit-depth for converting a second sampled analog signal to a digital representation; and
   changing the clock signal to a different frequency based on the second bit-depth to clock the successive approximation circuit when converting the second sampled analog signal to a digital representation.

2. The method of converting analog signals as recited in claim 1, wherein the step of selecting the clock signal to convert the first sampled analog signal further comprises:
   changing the frequency of the clock signal between at least two of the bit determinations when converting at least one of the first and second sampled analog signals.

3. The method of converting analog signals as recited in claim 1, further comprising:
   changing the frequency of the clock signal between each of the bit determinations when converting at least one of the first and second sampled analog signals.

4. A method as recited in claim 1, further comprising:
   sampling an analog signal to generate a sampled analog signal; and
   providing the sampled analog signal to the successive approximation circuit.

5. A method as recited in claim 4, further comprising:
   clocking the successive approximation circuit with the selected clock signal.

6. A method of converting analog signals to multibit representations, comprising the steps of
   selecting a first bit-depth for converting a first sampled analog signal to a digital representation;
   selecting a first clock signal, having a frequency, to clock a successive approximation circuit based on the first bit-depth to convert the first sampled analog signal to a digital representation;
   selecting a second bit-depth for converting a second sampled analog signal to a digital representation; and
   selecting a second clock signal, having a frequency different from the frequency of the first clock signal, to clock the successive approximation circuit based on the second bit-depth to convert the second sampled analog signal to a digital representation.

7. The method of converting analog signals as recited in claim 6, wherein the step of selecting the first clock signal further comprises:
   changing the frequency of the first clock signal between at least two bit determinations when converting at least one of the first and second sampled analog signals.

8. The method of converting analog signals as recited in claim 7, further comprising:
   changing the frequency of the first clock signal between each of the bit determinations when converting at least one of the first and second sampled analog signals.

9. A method of converting analog signals to multibit representations, comprising the steps of:
   selecting a first bit-depth for converting a first sampled analog signal to a digital representation;
   selecting a clock signal, having a frequency, to clock a successive approximation circuit based on the bit-depth selected to convert the first sampled analog signal to a digital representation;
   selecting a second bit-depth for converting a second sampled analog signal to a digital representation;
   changing the clock signal to a different frequency to clock the successive approximation circuit when converting the second sampled analog signal to a digital representation;
   sampling an analog signal to generate a sampled analog signal; and
   providing the sampled analog signal to the successive approximation circuit.

10. A method as recited in claim 9, further comprising:
    clocking the successive approximation circuit with the selected clock signal.

* * * * *